United States Patent [19]

Jesse et al.

[11] 4,280,166
[45] Jul. 21, 1981

[54] OVER-VOLTAGE PROTECTED SOLID-STATE IGNITION SYSTEM

[75] Inventors: Erich Jesse, Marbach; Reinhard Leussink, Vaihingen, both of Fed. Rep. of Germany

[73] Assignee: Robert Bosch GmbH, Stuttgart, Fed. Rep. of Germany

[21] Appl. No.: 929,939

[22] Filed: Aug. 9, 1978

[30] Foreign Application Priority Data

Aug. 11, 1977 [DE] Fed. Rep. of Germany ....... 2736178

[51] Int. Cl.³ .......................................... F02P 15/00
[52] U.S. Cl. .................................. 361/253; 123/644; 315/209 T
[58] Field of Search .............................. 361/253, 256; 123/148 E; 315/209 T

[56] References Cited

U.S. PATENT DOCUMENTS

| | | | |
|---|---|---|---|
| 3,949,722 | 4/1976 | Linstedt et al. | 315/209 T |
| 4,020,816 | 5/1977 | Chateau | 123/148 E |
| 4,130,101 | 12/1978 | Jundt et al. | 315/209 T |

Primary Examiner—C. C. Shaw
Attorney, Agent, or Firm—Frishauf, Holtz, Goodman and Woodward

[57] ABSTRACT

To prevent excessive current flow through the control transistor of a solid-state ignition system in which the control transistor is serially connected with an ignition coil, if the power supply voltage should exceed rated value, the voltage monitoring circuit, including a Zener diode, is connected across the power supply source. The solid-state ignition system includes a control transistor which controls the conduction state of the final or output transistor. The over-voltage circuit additionally controls the conduction state of this control transistor to conductive condition if over-voltage is sensed, thereby causing changeover of the final or output transistor to blocked state. A timing circuit including a capacitor is preferably included in the monitoring circuit so that application of control voltage to the control transistor is gradual, causing changeover of the main or output transistor likewise to be gradual and preventing generation of an undesired ignition event.

3 Claims, 1 Drawing Figure

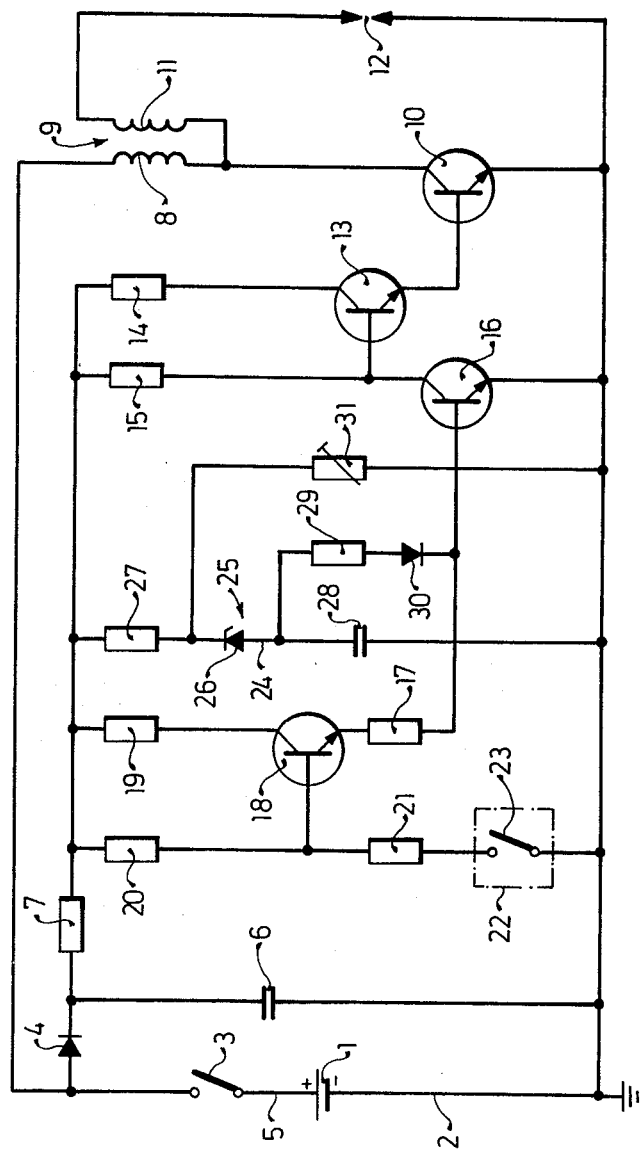

OVER-VOLTAGE PROTECTED SOLID-STATE IGNITION SYSTEM

Reference to related literature and application: German Disclosure Document DE-OS No. 2 702 864, assigned to the assignee of the present application.

The present invention relates to a solid-state, over-voltage protected ignition system for an internal combustion engine, and more particularly to a system in which a control transistor is serially connected to an ignition coil and a source of power, typically the battery of an automotive vehicle.

BACKGROUND AND PRIOR ART

Ignition coil controlled ignition systems for automotive vehicles in which a transistor is serially connected with the ignition coil are well known; such systems usually include a control circuit which controls the transistor to conductive state, whereupon current will flow from a source, typically the on-board network of a vehicle, including a battery, through the coil to the transistor to ground or chassis. When a sufficient amount of electromagnetic energy has been stored in the coil, the transistor is suddenly controlled to blocked state, causing an inductive high-voltage surge in the secondary of the ignition coil which provides the energy for flash-over of the spark of a spark gap, for example a spark plug. A distributor can be interposed in the secondary between the coil and the spark plug for multi-cylinder internal combustion engines. Under certain operating conditions of the vehicle, it is possible that the voltage supply exceeds a given nominal value; current through the transistor in series with the coil then will become excessive, leading to damage, and possible destruction thereof.

THE INVENTION

It is an object to provide an over-voltage supervisory circuit which is connected into the control circuit for the ignition system and which protects the system against over-voltages and particularly the output transistor thereof. The system should be simple and effective and lend itself to integration, as well as association with various types of ignition circuits.

Briefly, an over-voltage monitoring circuit is provided connected to the supply voltage which senses when the voltage of the source reaches a value which would cause excessive current flow through the controlled semiconductor switch, typically the transistor, in series with the ignition coil. This monitoring circuit is connected to a control transistor which controls the conductive state or cut-off of the semiconductor switch in series with the ignition coil. The control transistor itself is so connected that it is conductive when the serially connected transistor blocks; and in non-conductive state when the serially connected transistor is conductive. The monitoring circuit is so connected to the control transistor that a voltage is applied thereto which will cause the control transistor to change to conductive state, thus causing blocking of the controlled semiconductor switch, typically a power switching transistor, in series with the ignition coil. The circuit is preferably so arranged that change-over of the control transistor to conductive state is gradual, so that the power transistor also will change over gradually, thus preventing generation of an ignition pulse in the secondary of the ignition coil.

Drawings, illustrating a preferred example, wherein the single FIGURE is a schematic circuit diagram of an ignition system and an over-voltage protection circuit therefor; the ignition system itself contains only those elements necessary for an understanding of the present invention.

The ignition system shown in the FIGURE is suitable for an internal combustion engine (not shown) of an automotive vehicle (not shown), for example for a multi-cylinder engine. The source of electrical power is formed by a battery 1, typically the vehicle battery, one terminal of which is connected to a ground, chassis or reference connection 2. The positive terminal of the battery is connected through line 5 to a main switch 3, for example the ignition switch of the vehicle, and then through a supply line to the primary 8 of an ignition coil 9. The secondary 11 of the ignition coil 9 is connected to a spark plug 12; a distributor may be interposed between the secondary 11 and a multiplicity of spark plugs, as well known.

A reverse-polarity diode 4 is connected to a buffer capacitor 6, the other electrode of which is connected to ground or chassis. A dropping protective resistor 7 is connected to the cathode of diode 4.

The ignition circuit is closed when switch 3 is closed and an output switching transistor 10 has its collector-emitter path in conductive state. The npn output transistor has its collector connected to the ignition coil 9, and its emitter to ground or chassis. The base of the output transistor 10 is connected to the emitter of a driver transistor 13, the collector and the base of which, respectively, are connected through resistors 14, 15, respectively, to the other terminal of the dropping resistor 7 which, in turn, is connected through diode 4 to the positive terminal of battery 1 through switch 3. The base of the driver transistor 13 is additionally connected to the collector of an npn control transistor 16, the emitter of which is connected to chassis bus 2. The base of transistor 16 is connected through a resistor 17 to the emitter of an npn transistor 18. The collector of transistor 18 is connected through resistor 19 to the supply line from resistor 7. Its base is connected to a voltage divider formed by resistors 20, 21, serially connected to a signal source 22, for example formed as the breaker switch 23 of the ignition system of an automotive vehicle. Signal source 22 can be any control source which provides ignition control signals, and need not be a mechanical switch, but may, for example, be an optical, magnetic, or other type of transducer, including additional electronic circuitry which, in final effect, has the function to open and close the circuit through voltage divider 20, 21 and hence apply controlled voltages of different, controlled magnitudes to the base of transistor 18.

Basic operation of the ignition circuit: Let it be assumed that the internal combustion (IC) engine has started, and that the switch 23, or its electrical equivalent, is closed. Upon closing of ignition switch 3, the transistor 18 will not receive control current and it will block; this will also interrupt control current to the control transistor 16 so that its emitter-collector path will be effectively open-circuited, that is, the transistor will be blocked. This causes control current to flow over the base-emitter path of driver transistor 13 and hence through the base-emitter path of output transistor 10, so that transistors 13, 10 have conductive emitter-collector paths. Current will flow through the primary 8 of the ignition coil 9, storing magnetic energy for an ignition event. Upon opening of switch 23, at the ignition instant, control current will be provided for the base-emitter path of the input transistor 18, which likewise causes control current to flow through the base-emitter path of the control transistor 16, so that the emitter-collector paths of transistors 18, 16 will become conductive. This breaks control current flow through the base-emitter path of driver transistor 13 and hence of the output transistor 10, which transistors then will block rapidly. The interruption of current flow through the primary 8 of ignition coil 9 causes a high-voltage pulse to be induced in the secondary 11 which causes flash-over of the spark gap of spark plug 12. When switch 23 again closes, transistors 18, 16 will again block, causing transistors 13, 10 to become conductive, and the cycle will repeat.

The foregoing is the basic operation of a solid-state ignition system. The components, and specifically the semiconductor solid-state components, are designed to withstand certain maximum currents and voltages. Thus, the system must be matched to the supply voltage of battery 1. If the supply voltage exceeds the safe value for operation, the current through the emitter-collector path of the output transistor 10 can rise to such a level that the transistor will be damaged and, in a limiting case, may be destroyed. Over-voltages may arise, for example, if the battery is subjected to forcible charging and at that time the engine is started.

In accordance with the present invention, a voltage monitoring circuit 24 is included in the ignition system which is so arranged that the control transistor 16 will be controlled to become blocked if the voltage of the supply exceeds a predetermined level which is in excess of that which permits safe operation of transistor 10. To prevent generation of a spurious spark, the circuit is so arranged, in accordance with a feature of the invention, that the transistor 10 will change to blocked state at a rate which does not cause an inductive kick in the secondary of coil 9 which might trigger breakdown of the spark plug 12.

The voltage monitoring circuit 24 has a voltage-sensitive element 25 which breaks down when the voltage thereacross exceeds a predetermined level—for example a Zener diode. The breakdown element 25 is so connected that it forms a series connection together with the base-emitter path of the control transistor 16 to thereby control the transistor 16 to change to blocked state, which will cause transistors 13, 10 to become conductive. Use of a Zener diode 26 for the element 25 is preferred. The Zener diode is connected in normally blocked state. Its cathode is connected through a calibrating resistor 27 with the terminal of resistor 7 remote from the cathode 4; the anode of the Zener diode is connected through a control capacitor 28 to chassis bus 2. Additionally, the anode of Zener diode 26 is connected through a second calibrating resistor 29 and a diode 30 to the base of the transistor 16. The diode 30 is so poled that the cathode thereof is connected to the base of transistor 16. An adjustable resistor 31 is connected from the junction between the cathode of Zener diode 26 and chassis bus 2. The resistor 31 can be adjusted to accurately match the voltage at which Zener diode 26 should break down, that is, at which the voltage protective circuit should become effective. Its setting will depend on the over-voltage rating of the transistor 10, that is, the over-voltage at which the circuit 24 is to become effective.

Operation: If the voltage at the positive terminal of battery 1 becomes excessive, Zener diode 26 will break down causing control current to flow through resistor 29, diode 30 and the base-emitter path of control transistor 16 which, then, will cause its emitter-collector path to be conductive. The base-emitter path of driver transistor 13 and hence of the output transistor 10 will thus block, controlling the emitter-collector path of the output transistor 10 to interrupt. Thus, if the voltage exceeds a predetermined level, no further current can flow through the emitter-collector path of the output transistor 10 and the transistor 10 is protected against excessive current flow.

Disconnecting the current flow through the transistor 10 is enhanced by the presence of the dropping resistor 10 which is common to the monitoring circuit 24 and the control circuit for the transistor 10, that is, the circuit connections through transistors 18, 16. Thus, disconnecting current flow through the primary 8 will cause a rise in voltage across the monitoring circuit branch 24 which results in reliable and complete change-over of state of the control transistor 16 and hence change-over of the output transistor 10. The capacitor 28 filters brief voltage peaks which may arise, for example, when inductive loads other than the ignition system, and also connected to battery 1, are disconnected. Such inductive loads may, for example, be blower motors or the like in the on-board electrical system of an automotive vehicle. The capacitor 28, when suitably dimensioned, also has the effect that it introduces a time delay for change-over of transistor 16, and hence of transistors 13 and and 10 by effecting gradual change-over of the respective transistors and not suddenly. After breakdown of the Zener diode 26, the voltage at the capacitor 28 will rise gradually. Thus, the emitter-collector path of the control transistor 16 will become conductive only gradually and the emitter-collector path of the output transistor 10 will follow this gradual change of state and become more and more resistive until it finally changes to blocked state. This gradual change-over from conduction to blocked state inhibits generation of a spark at spark plug 12 which, otherwise, results when current through the primary 8 is suddenly interrupted.

The switch 23, in its simplest case, is a mechanical switch; it may, however, be the emitter-collector path of a transistor controlled by any other signal source; or it may be a flip-flop circuit constructed like a Schmitt-trigger, or a monostable multivibrator, and form a circuit component, for example a transistor thereof.

Various changes and modifications may be made, and the over-voltage monitoring circuit including, essentially, breakdown element 25, preferably Zener diode 26 and, desirably, capacitor 28, may be coupled to various types of control elements of various types of ignition systems by a suitable coupling network, for example as shown by a resistor 29 - diode 30 combination.

We claim:

1. Over-voltage protected ignition system for an internal combustion engine, for connection to a source of power (1) and to a source of ignition signals (20–23) having an ignition coil (9);

a power transistor (10) serially connected to the source of power and the ignition coil;

and a control circuit including a control transistor (16) which, in turn, controls the switching state of the power transistor, the control circuit being connected to cause the control transistor to be in conductive state when the power transistor is blocked, and vice-versa, and a base circuit (17–19) connected to said control transistor (16) and controlled by said source of ignition signals;

and comprising a power source over-voltage monitoring circuit (24) sensing when the voltage of the source reaches a value which would cause excessive current flow through the power transistor (10) and connected to the control transistor (16) to apply a voltage to the control transistor which causes the control transistor to assume non-conductive state, including a breakdown circuit element (25) abruptly changing its state of current conduction upon occurrence of a threshold voltage condition, the breakdown element (25) being serially connected to the base-emitter path of the control transistor (16) and providing an over-voltage conduction signal thereto;

a dropping protective resistor (7) having one terminal connected to the power source;

a parallel circuit network formed by the control circuit for the power transistor (10) and the over-voltage monitoring circuit (24) one end point of the parallel circuit network being connected to the control electrode of the power transistor (13), the other end point of the parallel circuit network being connected to the terminal of said dropping protective resistor (7) remote from the power source, so that the dropping protector resistor will form a common dropping resistor for the branches of said parallel circuit network;

and a capacitor (28) which provides, upon occurrence of an over-voltage condition, for gradual application of the over-voltage signal to the control transistor to control said control transistor (16) to become conductive gradually, thus causing disconnection of the power transistor (10) and inhibiting generation of a spurious ignition event and spurious response upon presence of noise pulses, while providing for reliably decreased reduction of the power transistor upon excessive over-voltage of the source.

2. System according to claim 1 wherein the over-voltage monitoring circuit includes a coupling circuit (29, 30) connecting the breakdown element and the control transistor;

and the capacitor is connected to the coupling circuits to modify the transfer rate of coupling of the over-voltage signal arising upon breakdown of the voltage breakdown element to the control transistor (16) to cause the control transistor to gradually change state and hence to provide a gradually changing control voltage to the power transistor (10).

3. System according to claim 1 or 2 wherein the breakdown circuit element (25) is a zener diode.

* * * * *